United States Patent
Yu et al.

(10) Patent No.: US 10,686,438 B2
(45) Date of Patent: Jun. 16, 2020

(54) GLITCH PREVENTING INPUT/OUTPUT CIRCUITS

(71) Applicant: Taiwan Semiconductor Manufacturing Co., Ltd., Hsinchu (TW)

(72) Inventors: Tsung-Hsin Yu, Hsinchu (TW); Nick Pai, Taichung (TW); Bo-Ting Chen, Fengyuan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/965,875

(22) Filed: Apr. 28, 2018

(65) Prior Publication Data

US 2019/0068182 A1 Feb. 28, 2019

Related U.S. Application Data

(60) Provisional application No. 62/551,467, filed on Aug. 29, 2017.

(51) Int. Cl.
*H03K 17/16* (2006.01)
*H03K 19/003* (2006.01)

(52) U.S. Cl.
CPC ..... *H03K 17/162* (2013.01); *H03K 19/00361* (2013.01)

(58) Field of Classification Search
None
See application file for complete search history.

(56) References Cited

U.S. PATENT DOCUMENTS

| 5,081,374 A * | 1/1992 | Davis ............... H03K 19/01721 326/27 |
| 6,262,599 B1 | 7/2001 | Coughlin, Jr. et al. |
| 7,126,400 B2 | 10/2006 | Tamura |
| 7,855,575 B1 * | 12/2010 | Hsu ................... H03K 3/35613 326/63 |

(Continued)

FOREIGN PATENT DOCUMENTS

| JP | 2006017990 A | 1/2006 |
| JP | 2012004786 A | 1/2012 |

(Continued)

OTHER PUBLICATIONS

Official Action dated Dec. 17, 2018, in corresponding Taiwan Patent Application No. 10721179370.

*Primary Examiner* — Minh D A
*Assistant Examiner* — James H Cho
(74) *Attorney, Agent, or Firm* — Duane Morris LLP (57) ABSTRACT

Circuits and methods for preventing glitch in a circuit are disclosed. In one example, a circuit coupled to an input/output pad is disclosed. The circuit includes: a first level shifter, a second level shifter, and a control logic circuit. The first level shifter is configured for generating a data signal. The second level shifter is configured for generating an output enable signal. The first and second level shifters are controlled by first and second power-on-control signals, respectively. The control logic circuit is coupled to the first level shifter and the second level shifter, and configured for driving the input/output pad to a voltage level based on the data signal and the output enable signal.

20 Claims, 9 Drawing Sheets

(56) References Cited

U.S. PATENT DOCUMENTS

| | | | |
|---|---|---|---|
| 7,928,756 B1* | 4/2011 | Lu | H03K 19/00361 |
| | | | 326/27 |
| 8,446,173 B1* | 5/2013 | Faucher | H03K 19/00361 |
| | | | 326/27 |
| 9,344,088 B1* | 5/2016 | Sanchez | H03K 19/01852 |
| 2004/0085114 A1 | 5/2004 | Hong et al. | |
| 2006/0001599 A1 | 1/2006 | Onozawa et al. | |
| 2008/0036490 A1* | 2/2008 | Kim | H03K 19/007 |
| | | | 326/14 |
| 2008/0061832 A1 | 3/2008 | Hu et al. | |
| 2010/0013518 A1* | 1/2010 | Theoduloz | H03K 19/01758 |
| | | | 326/81 |
| 2012/0212270 A1 | 8/2012 | Ishimatsu | |
| 2015/0091608 A1* | 4/2015 | Rajagopal | H03K 19/007 |
| | | | 326/14 |

FOREIGN PATENT DOCUMENTS

| | | |
|---|---|---|
| JP | 2012175437 A | 9/2012 |
| KR | 19990049424 A | 7/1999 |
| KR | 1020060005515 A | 1/2006 |

\* cited by examiner

GLITCH PREVENTING INPUT/OUTPUT CIRCUITS

CROSS-REFERENCE TO RELATED APPLICATION

The present application claims priority to U.S. Provisional Patent Application No. 62/551,467, filed on Aug. 29, 2017, which is incorporated by reference herein in its entirety.

BACKGROUND

Integrated circuit chips (IC chips) or semiconductor die are typically encapsulated in a package to protect the circuitry formed on the semiconductor die from external elements. An IC chip includes bond pads formed thereon. Bond wires, or other electrical connection means, are used to electrically connect the bond pads to corresponding pins or leads of the integrated circuit package. The bond pads can be power pads for power supply voltages connections and input/output (I/O) pads for connecting to input and output signals of the integrated circuit. An I/O circuit is a circuit coupled to an I/O pad of a chip and configured to communicate input and/or output signals with other chips in the integrated circuit system.

A glitch is an undesired transition state that occurs before a signal settles to its intended value. Glitching poses a critical issue for an I/O circuit, e.g. during power ramp-up of the circuit. A key factor impacting the glitch issue in an I/O circuit is the signal sequence of a data signal and an output enable signal in the I/O circuit. In a conventional method, the signal sequence is controlled by system level signals, which is not suitable for high-speed circuit operations. In another conventional method, a power-on-control (POC) mechanism is required to be added externally to control the I/O circuit in tristate and avoid crowbar-currents during power ramp up. For this external POC method, customers of the integrated circuit have to modify their system design to control POC behavior by themselves, which is a huge effort for the customers. As such, existing I/O circuits are not entirely satisfactory in terms of glitch prevention.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

The present disclosure provides various embodiments of glitch preventing I/O circuits and methods for preventing glitches in I/O circuits. In some embodiments, a gating circuit is provided to control the signal sequence of a data signal and an output enable signal in the I/O circuit, to prevent any glitch from occurring especially when a core circuit to which the I/O circuit is coupled and the I/O circuit are respectively powered up or turned on, i.e. to ensure no glitch during a power ramp-up process of the I/O circuit. For example, the I/O circuit includes a first level shifter configured for generating the data signal, a second level shifter configured for generating the output enable signal, and a control logic circuit configured for driving an input/output pad to a desired voltage level based on the data signal and the output enable signal.

To ensure the signal sequence of the data signal and the output enable signal, two separate (first and second) power-on-control signals are used to control the first and second level shifters, respectively, in accordance with some embodiments. The gating circuit can generate the data signal and the output enable signal, and can control the signal sequence of the data signal and the output enable signal to ensure that: the first power-on-control signal enables the first level shifter to generate the data signal before the second power-on-control signal enables the second level shifter to generate the output enable signal. In this manner, no glitch will appear during the power ramp-up process of the I/O circuit because the data signal is ready and active before the output enable signal is ready and active.

In one embodiment of the present teaching, the gating circuit includes a first transistor gated by the data signal, a second transistor gated by a signal that is a logical inversion or complement of the first power-on-control signal, and a first inverter configured to generate the second power-on-control signal based on outputs of the first transistor and the second transistor. The structure of the gating circuit ensures that the second power-on-control signal is generated based on whether the data signal has reached a stable logic state, which avoids glitches in the I/O circuit.

In another embodiment of the present teaching, the gating circuit includes a series circuit having an even number of inverters connected in series. The series circuit receives the first power-on-control signal as an input signal and generates the second power-on-control signal as an output signal. The even number is designed to be large enough to ensure that the second power-on-control signal is generated after the data signal has reached a stable logic state.

The present disclosure is applicable to any I/O circuit, e.g. a general purpose input output (GPIO) circuit, in an integrated circuit chip. In some embodiments, the power-on-control signal is generated by an internal block of the integrated circuit chip, such that customers of the integrated circuit chip do not need to add extra effort to control the signal sequence. In addition, the gating circuit disclosed herein merely occupies a small area compared to the total area of the I/O circuit, which has minimum or no area impact to the I/O circuit. Furthermore, the gating circuit does not have performance impact to normal operation of the I/O circuit, while avoiding glitches during power ramp-up of the I/O circuit. According to some embodiments of the present teaching, the I/O circuit includes one or more additional gating circuits configured to generate more power-on-control signals and control a signal sequence of all power-on-control signals based on a predetermined design, to ensure a desirable timing sequence of signals in the I/O circuit.

Figure 1:
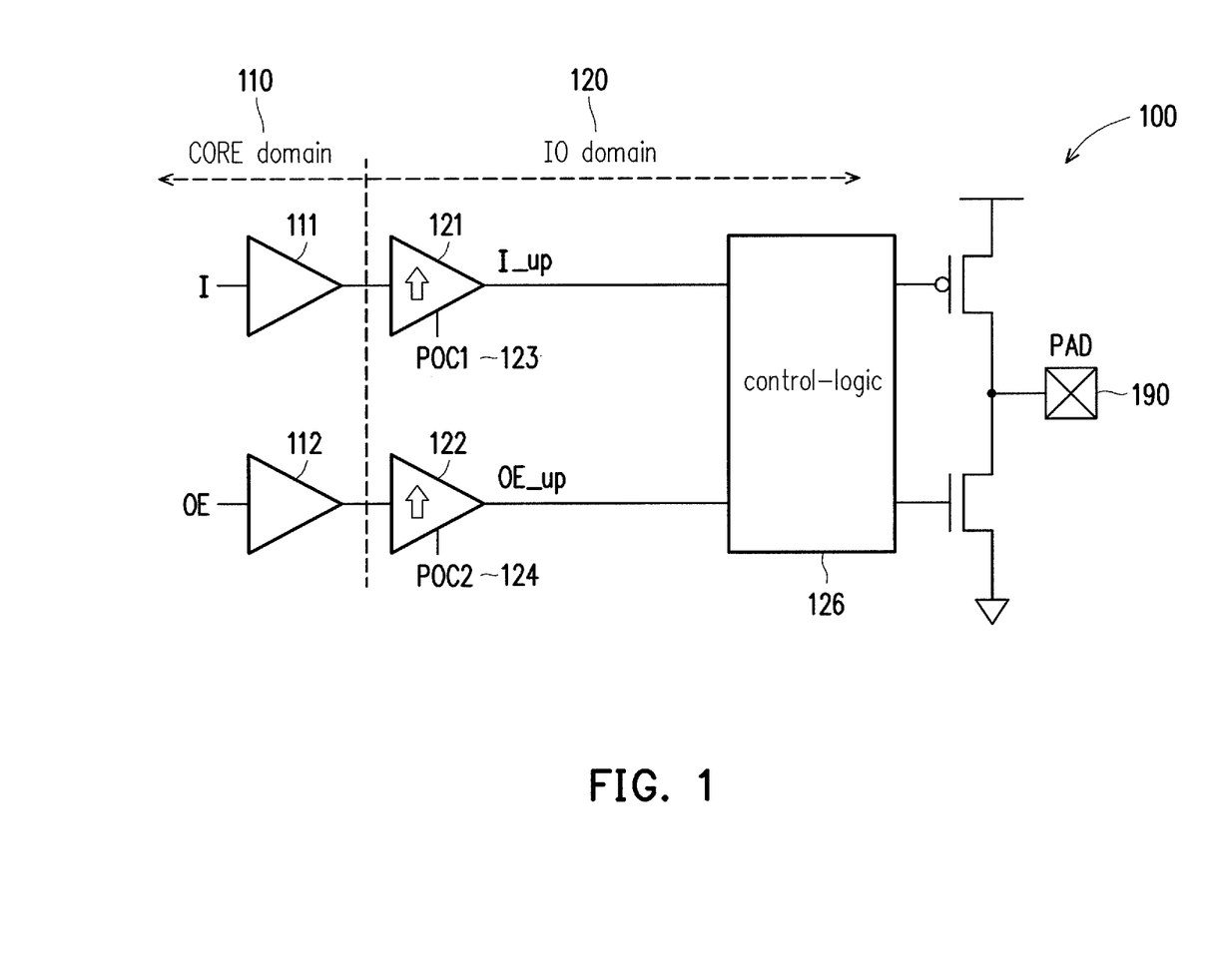
FIG. 1 illustrates an exemplary block diagram of a circuit coupled to an input/output pad, in accordance with some embodiments of the present disclosure.

FIG. 1 illustrates an exemplary block diagram of a circuit 100 coupled to an input/output pad 190, in accordance with some embodiments of the present disclosure. In accordance with one embodiment, the circuit 100 may be part of a chip in an integrated circuit system. The chip can communicate with other chips in the system via the I/O pad 190 controlled by the I/O circuit 100. As shown in FIG. 1, the circuit 100 includes two portions, a core portion 110 having a first voltage domain and an I/O portion 120 having a second voltage domain.

In this example, the core portion 110 includes a first buffer 111 that receives an input data signal I and generates a smoothed data signal with a same voltage level as the input data signal I. The input data signal I may be generated by a core circuit connected to the first buffer 111. The core circuit (not shown) performs a core function of the chip according to customer design. The core circuit generates the input data signal I to output data to another chip via the I/O pad 190. The input data signal I generated by the core circuit has a voltage within a core domain, e.g. 0 V to 0.75 V.

The core portion 110 in this example also includes a second buffer 112 that receives an output enable signal OE and generates a smoothed OE signal with a same voltage level as the output enable signal OE. The output enable signal OE is also generated by the core circuit connected to the second buffer 112. The core circuit generates the output enable signal OE to control the data output to another chip via the I/O pad 190. The output enable signal OE generated by the core circuit has a voltage within the core domain, e.g. 0 V to 0.75 V.

The I/O portion 120 in this example includes a first level shifter 121 that is coupled to the first buffer 111 and receives the smoothed data signal from the first buffer 111. The first level shifter 121 can shift the smoothed data signal from the core voltage domain to an I/O voltage domain, e.g. 0 V to 1.98 V. The I/O voltage domain in this example is higher than the core voltage domain, such that the first level shifter 121 can shift the smoothed data signal from a low voltage state to a high voltage state. That is, the first level shifter 121 is a level up shifter in this example. The shifting operation at the first level shifter 121 is controlled by a power-on-control (POC) signal POC1 123. The shifting operation will be performed upon a triggering of the POC1 signal 123. That is, a state change (e.g. from a high voltage state to a low voltage state) of the POC1 signal 123 will enable the first level shifter 121 to shift the smoothed data signal from the core voltage domain to the I/O voltage domain, and to generate a level-up data signal I_up within the I/O voltage domain. The level-up data signal I_up is to be sent or output to another chip via the I/O pad 190.

The I/O portion 120 in this example also includes a second level shifter 122 that is coupled to the second buffer 112 and receives the smoothed OE signal from the second buffer 112. The second level shifter 122 can shift the smoothed OE signal from the core voltage domain to the I/O voltage domain, e.g. 0 V to 1.98 V. The I/O voltage domain in this example is higher than the core voltage domain, such that the second level shifter 122 can shift the smoothed OE signal from a low voltage state to a high voltage state. That is, the second level shifter 122 is a level up shifter in this example. The shifting operation at the second level shifter 122 is controlled by a power-on-control (POC) signal POC2 124. The shifting operation will be performed upon a triggering of the POC2 signal 124. That is, a state change (e.g. from a high voltage state to a low voltage state) of the POC2 signal 124 will enable the second level shifter 122 to shift the smoothed OE signal from the core voltage domain to the I/O voltage domain, and to generate a level-up OE signal OE_up within the I/O voltage domain. The level-up OE signal OE_up is to be used to control the data output of the level-up data signal I_up to another chip via the I/O pad 190.

The POC1 signal 123 and the POC2 signal 124 are two separate signals that can control the level shifting's of the first level shifter 121 and the second level shifter 122, respectively. A gating circuit (not shown in FIG. 1), to be discussed in detail later, may be used to control a signal sequence of the POC1 signal 123 and the POC2 signal 124. Accordingly, the gating circuit can also control a signal sequence of the level-up data signal I_up and the level-up OE signal OE_up. Specifically, the gating circuit can control the level-up OE signal OE_up to be generated after the level-up data signal I_up is generated and has reached to a stable logic state, to prevent glitch from occurring during a power ramp-up process of the circuit. During a power ramp-up process, the power of the I/O circuit and the power of the core circuit are increased. This may happen when the integrated circuit on the chip is turned on and starts working. After the power ramp-up process, the circuit begins normal operations. The POC1 signal 123 and the POC2 signal 124 will not impact the normal operations of the circuit, because they will be kept in a logic low state and enable the first level shifter 121 and the second level shifter 122 to work normally.

The I/O portion 120 in this example also includes a control logic circuit 126 that is coupled to the first level shifter 121 and the second level shifter 122 and is configured for driving the I/O pad 190 to a voltage level based on the data signal I_up and the output enable signal OE_up. That is, the control logic circuit 126 can output the data signal I_up via the I/O pad 190 in response to the output enable signal OE_up. Specifically, when the output enable signal OE_up is not asserted, the control logic circuit 126 is in a tri-state mode and does not drive the I/O pad 190. When the output enable signal OE_up is asserted, the control logic circuit 126 drives the I/O pad 190 to a voltage level and/or a logical state corresponding to the data signal I_up.

Although not shown in FIG. 1, the circuit 100 may also include an input buffer that is in the I/O portion 120 to receive an input signal from another chip via the I/O pad 190 and drive the input signal into a level down shifter in the core portion 110. The level down shifter can shift the input signal from the I/O voltage domain to the core voltage domain for the core circuit to receive the input signal with a proper voltage domain.

Figure 2A:
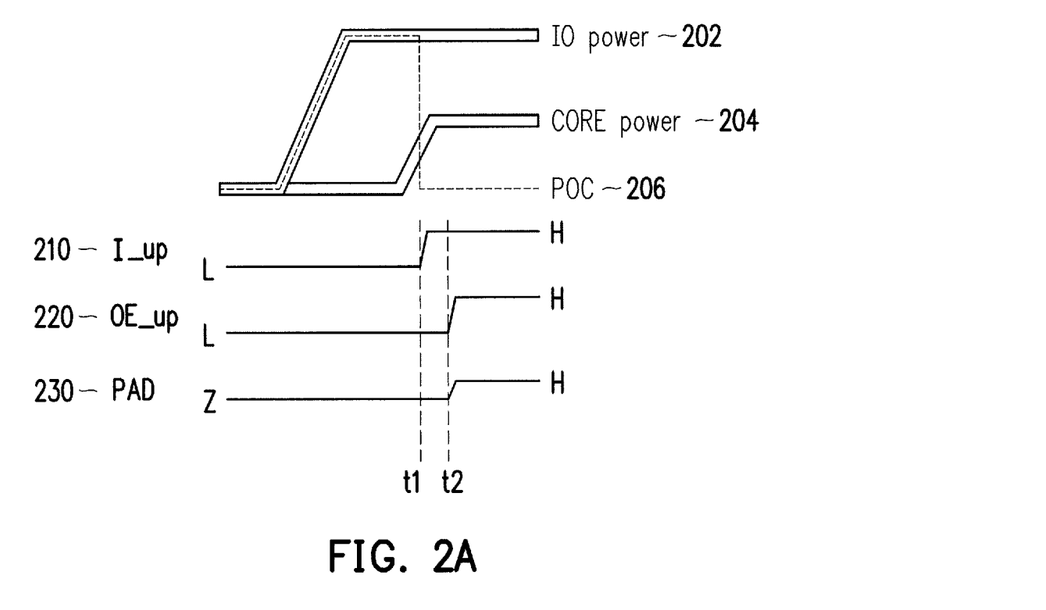
FIG. 2A illustrates an exemplary circuit behavior during power ramp-up.

During a power ramp-up process, two possible scenarios may happen in the I/O circuit. FIG. 2A illustrates an exemplary circuit behavior of the I/O circuit according to a first scenario during a power ramp-up process. As shown in FIG. 2A, the I/O power 202 of the I/O portion 120 first increases to a high voltage state within the I/O voltage domain during the power ramp-up process. The POC power 206 increases together with the I/O power 202. Then, the core power 204 of the core portion 110 increases to a high voltage state within the core voltage domain. During the increasing process of the core power 204, the POC power 206 is lowered to a low voltage state. In this example, one POC signal is used to enable shifting operations at both the first level shifter 121 and the second level shifter 122 upon a low voltage state of the POC power 206. That is, in response to the low voltage state of the POC power 206, the first level shifter 121 and the second level shifter 122 start to work normally as level up shifters to shift up the voltage levels of the I_up signal 210 and the OE_up signal 220, respectively.

Here, the same POC signal serves as a gating signal of both the first level shifter 121 and the second level shifter 122 before the powers are ready. There is no control of the time sequence of the POC signal entering the first level shifter 121 and the second level shifter 122. Although generated as one signal, the POC signal may enter the first level shifter 121 and the second level shifter 122 at different timing points, such that the I_up signal 210 and the OE_up signal 220 may increase to a high voltage state at different timing points.

For example, in the scenario shown in FIG. 2A, the I_up signal 210 increases from the low voltage state L to the high voltage state H at time t1, while the OE_up signal 220 increases from the low voltage state L to the high voltage state H at time t2 after time t1. In this case, there is no glitch occurring during the power ramp-up, as the pad power 230 of the I/O pad 190 increases smoothly from a reference voltage state Z to a high voltage state H together with the increase of the power of the OE_up signal 220. This is because the I_up signal 210 has reached a stable high voltage state before the OE_up signal 220 increases to the high voltage state, such that when the OE_up signal 220 reaches the high voltage state to assert, the pad power 230 of the I/O pad 190 will be driven directly to a high voltage state according to the stable high voltage state of the I_up signal 210.

Figure 2B:
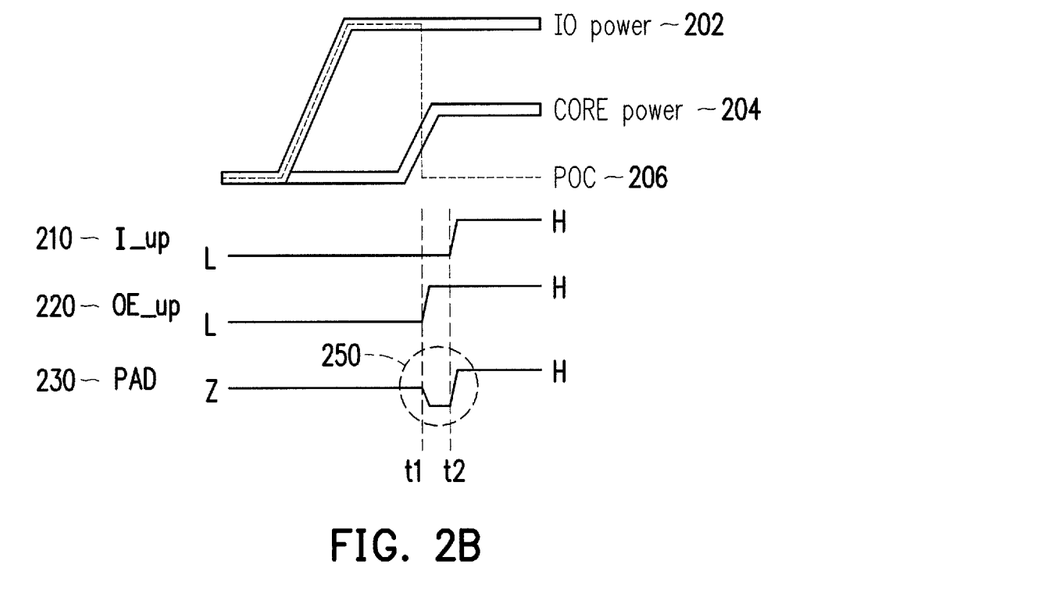
FIG. 2B illustrates another exemplary circuit behavior during power ramp-up.

FIG. 2B illustrates another exemplary circuit behavior of the I/O circuit according to a second scenario during a power ramp-up process. As shown in FIG. 2B, the I/O power 202 of the I/O portion 120 first increases to a high voltage state within the I/O voltage domain during the power ramp-up process. The POC power 206 increases together with the I/O power 202. Then, the core power 204 of the core portion 110 increases to a high voltage state within the core voltage domain. During the increasing process of the core power 204, the POC power 206 is lowered to a low voltage state. Similar to the first scenario, in this example, one POC signal is used to enable shifting operations at both the first level shifter 121 and the second level shifter 122 upon a low voltage state of the POC power 206. That is, in response to the low voltage state of the POC power 206, the first level shifter 121 and the second level shifter 122 start to work normally as level up shifters to shift up the voltage levels of the I_up signal 210 and the OE_up signal 220, respectively. As discussed above, the same POC signal serves as a gating signal of both the first level shifter 121 and the second level shifter 122 before the powers are ready; and there is no control of the time sequence of the POC signal entering the first level shifter 121 and the second level shifter 122. Although generated as one signal, the POC signal may enter the first level shifter 121 and the second level shifter 122 at different timing points, such that the I_up signal 210 and the OE_up signal 220 may increase to a high voltage state at different timing points.

For example, in the scenario shown in FIG. 2B, the OE_up signal 220 increases from the low voltage state L to the high voltage state H at time t1, while the I_up signal 210 increases from the low voltage state L to the high voltage state H at time t2 after time t1. In this case, there is a glitch 250 occurring during the power ramp-up, as the pad power 230 of the I/O pad 190 glitches first and then increases from a reference voltage state Z to a high voltage state H with the increase of the power of the I_up signal 210. This is because the I_up signal 210 increases to the high voltage state after the OE_up signal 220 increases to the high voltage state, such that when the OE_up signal 220 reaches the high voltage state to assert, the pad power 230 of the I/O pad 190 will not be driven directly to the high voltage state as the I_up signal 210 still has a low voltage power. The OE signal in this case gates a wrong I_up state into the I/O pad. Then when the I_up signal 210 increases to the high voltage power at t2, the pad power 230 of the I/O pad 190 is driven to the high voltage state according to the high voltage state of the I_up signal 210.

To avoid this glitch 250 as in FIG. 2B and ensure circuit behavior to be always like the first scenario in FIG. 2A during a power ramp-up process, the present teaching discloses various embodiments of a gating circuit to generate two separate POC signals for controlling the first level shifter 121 and the second level shifter 122 respectively and to control the signal sequence of the two separate POC signals.

Figure 3:
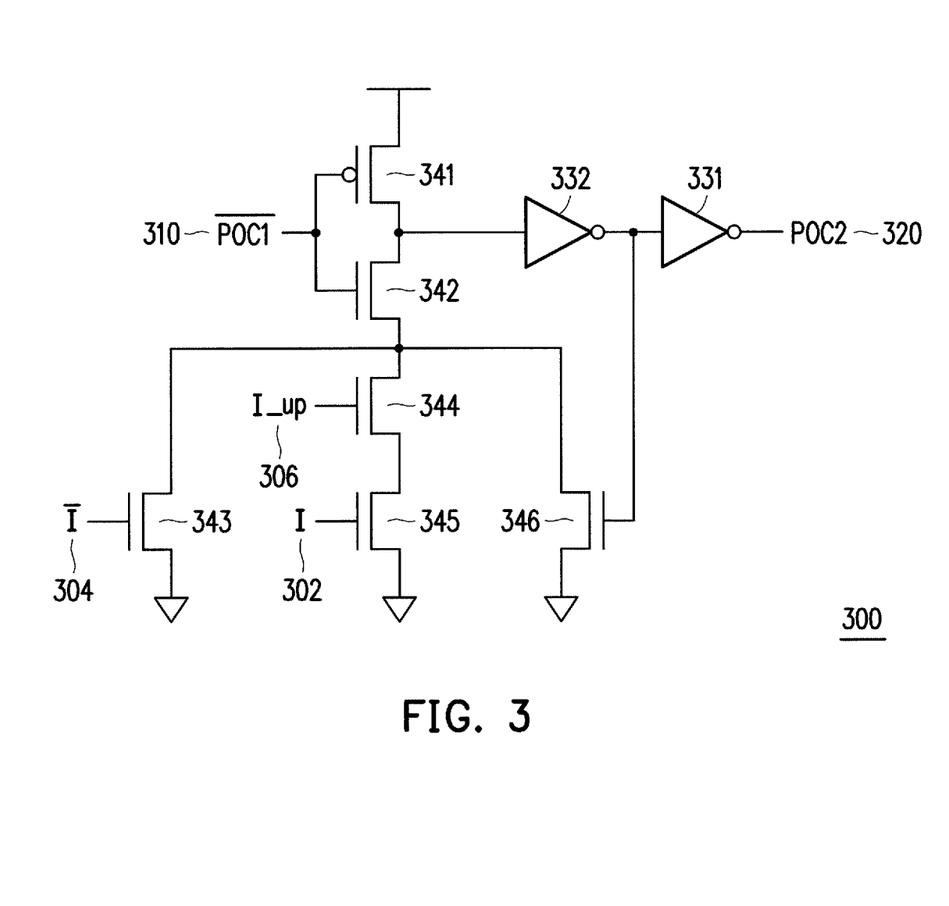
FIG. 3 illustrates an exemplary gating circuit in an input/output circuit, in accordance with some embodiments of the present disclosure.

FIG. 3 illustrates an exemplary gating circuit 300 in an input/output circuit, e.g. the circuit 100 in FIG. 1, in accordance with some embodiments of the present disclosure. As shown in FIG. 3, the gating circuit 300 includes six transistors 341, 342, 343, 344, 345, 346, and two inverters 332, 334. The gating circuit 300 includes a first transistor 341 and a second transistor 342 (e.g., an n-type MOSFET and a p-type MOSFET, respectively) that are commonly gated by a logical invert of the first power-on-control signal POC1 310. In this example, as the logical invert of the POC1 signal 310 is inverted again when entering the first transistor 341, the first transistor 341 is effectively gated by the POC1 signal 310. The gating circuit 300 includes a third transistor 343 that is coupled to the second transistor 342 and is gated by a logical invert of the signal I 304. The gating circuit 300 includes a fourth transistor 344 (e.g., an n-type MOSFET) that is gated by the signal I_up 306. The gating circuit 300 includes a fifth transistor 345 (e.g., an n-type MOSFET) that is coupled to the fourth transistor 344 and gated by the signal I 302.

The gating circuit 300 includes a first inverter 331 configured to generate the second power-on-control signal POC2 320 based on outputs of one or more of the six transistors. The gating circuit 300 also includes a second inverter 332 coupled between the first transistor 341 and the first inverter 331. The gating circuit 300 also includes a sixth transistor 346 coupled to the fifth transistor 345 and gated by an output signal of the second inverter 332.

With this exemplary structure of the gating circuit 300, the second power-on-control signal POC2 320 is activated after the first power-on-control signal POC1 is activated. In one example, the POC1 signal is first activated, i.e. changed from a high voltage state to a low voltage state. Accordingly, the logical invert of the first power-on-control signal POC1 310, as an input signal to the first transistor 341 and the second transistor 342, is changed from a low voltage state to a high voltage state. Then, the first transistor 341 is turned off and the second transistor 342 is turned on. As such, the input of the second inverter 332 is changed from a high voltage state to a low voltage state. Then the input of the first inverter 331 is changed from a low voltage state to a high voltage state. Accordingly, the output of the first inverter 331 is changed from a high voltage state to a low voltage state, i.e. the second power-on-control signal POC2 320 is activated. Therefore, the signal POC2 320 is activated after the signal POC1 is activated. The third transistor 343, the fourth transistor 344, the fifth transistor 345, and the sixth transistor 346 can help controlling the gating circuit 300. For example, by connecting the control end of the sixth transistor 346 with the output of the second inverter 332, the sixth transistor 346 enables the drain end of the fourth transistor 344 to be stabilized after the power ramp up process.

In the above example, once the signal POC1 is activated and changed to a low voltage state, the first level shifter 121 will start to work normally as a level up shifter to shift up the voltage level of the I_up signal 306. Similarly, once the signal POC2 is activated and changed to a low voltage state, the second level shifter 122 will start to work normally as a level up shifter to shift up the voltage level of the OE_up signal. Because the structure of the gating circuit 300 ensures that the signal POC2 320 is activated after the signal POC1 is activated, the OE_up signal is also ensured to be generated or shifted up in response to the POC2 signal 320 after the data signal I_up is generated or shifted up in response to the POC1 signal, which prevents glitches from occurring during a power ramp-up process. According to various embodiments of the present teaching, one or more components (transistors or inverters) of the gating circuit 300 may be removed or replaced without affecting the time dependence between the two POC signals, such that the gating circuit 300 can still prevent glitches from occurring during the power ramp-up process.

Figure 4:
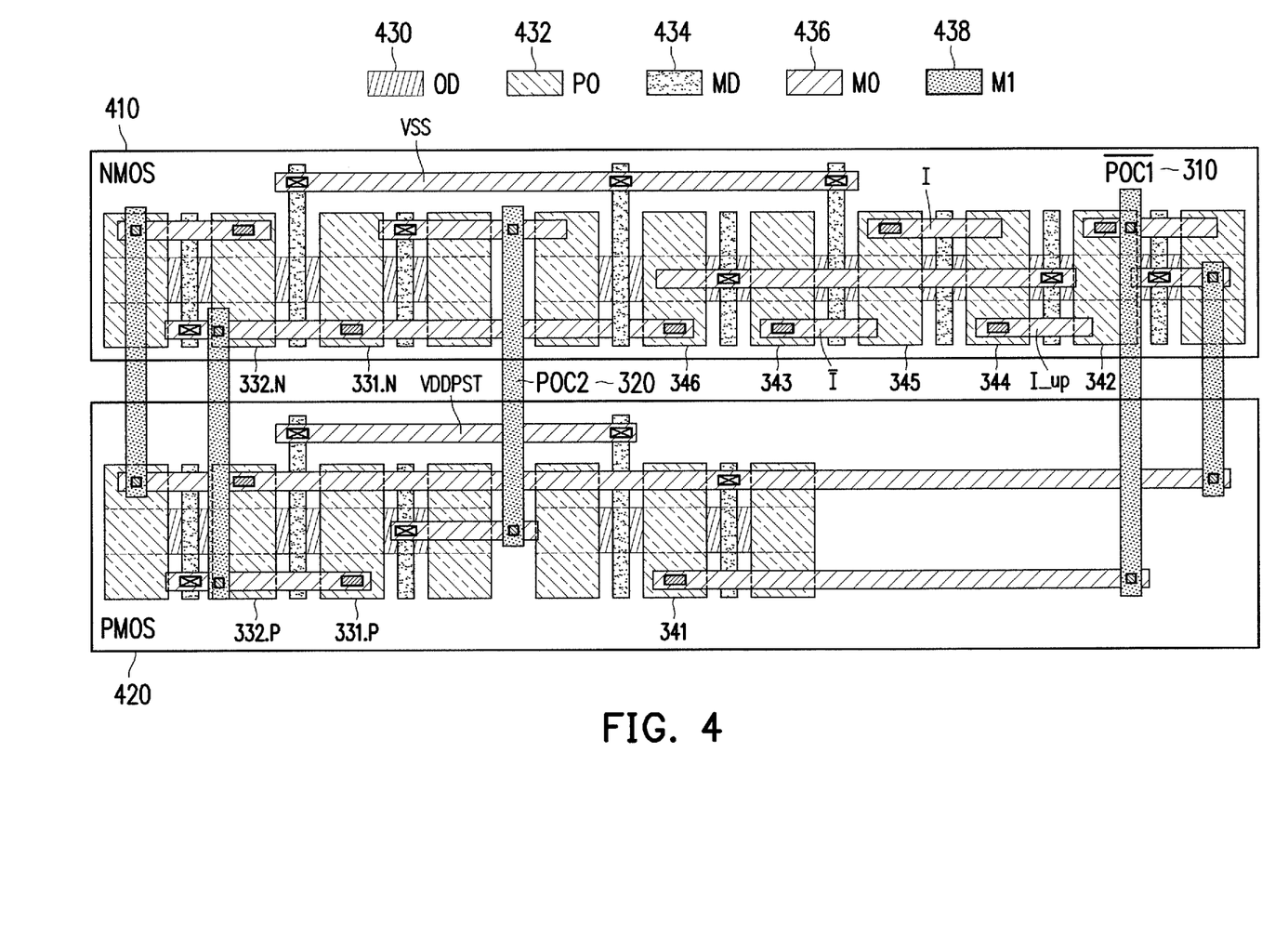
FIG. 4 illustrates an exemplary layout of a gating circuit in an input/output circuit, in accordance with some embodiments of the present disclosure.

FIG. 4 illustrates an exemplary layout of a gating circuit, e.g. the gating circuit 300 in FIG. 3, in an input/output circuit, in accordance with some embodiments of the present disclosure. As shown in FIG. 4, the layout may include an N-type metal-oxide-semiconductor (NMOS) portion 410 and a P-type metal-oxide-semiconductor (PMOS) portion 420, which is illustrated for example. The layout in FIG. 4 includes an oxide diffusion (OD) layer 430, a polysilicon (PO) layer 432 formed above the OD layer 430, and a metal over oxide (MD) layer 434 formed above the OD layer 430. Different components of the gating circuit 300 in FIG. 3 are marked at corresponding portions of the layout. For example, the transistor 341 is implemented at the PMOS portion 420; while the transistors 342, 343, 344, 345, 36 are implemented at the NMOS portion 410. The first inverter 331 includes both an NMOS part 331.N implemented at the NMOS portion 410, and a PMOS part 331.P implemented at the PMOS portion 420. Similarly, the second inverter 332 includes both an NMOS part 332.N implemented at the NMOS portion 410, and a PMOS part 332.P implemented at the PMOS portion 420. The layout further includes a metal-zero (M0) layer 436 formed on the PO layer 432 and the MD layer 434; and includes a metal-one (M1) layer 438 formed on the M0 layer 436. Each of the M0 layer 436 and the M1 layer 438 includes metal lines connecting the different components of the gating circuit. As shown in FIG. 4, an I/O power supply pin (VDDPST) is coupled to the M0 layer 436 in the PMOS portion 420; while a ground reference pin (VSS) is coupled to the M1 layer 438 in the NMOS portion 410.

The logical complement of the POC1 signal 310 and the POC2 signal 320 are controlled to have a specific time dependent relationship as discussed above, based on the exemplary layout shown in FIG. 4. In one embodiment, the layout of the gating circuit merely occupies an area that is less than a predetermined percentage (e.g. 0.5%, 1%, etc.) of a total area of the I/O circuit. As such, the gating circuit has little or no impact on the implementation area of the I/O circuit. The layout shown in FIG. 4 is just one example for implementing the gating circuit 300 in FIG. 3, and other layouts may be used to implement the gating circuit 300 in FIG. 3 according to various embodiments of the present teaching.

Figure 5:
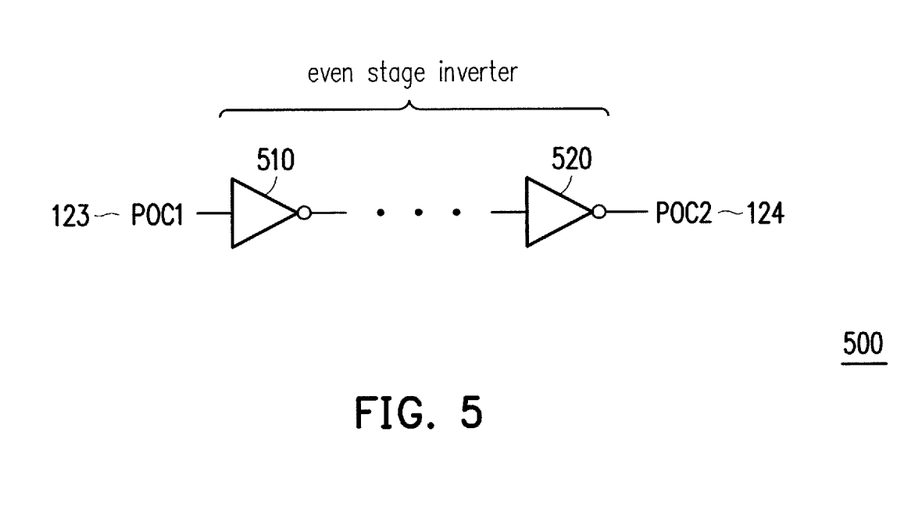
FIG. 5 illustrates another exemplary gating circuit in an input/output circuit, in accordance with some embodiments of the present disclosure.

FIG. 5 illustrates another exemplary gating circuit 500 in an input/output circuit, e.g. the circuit 100 in FIG. 1, in accordance with some embodiments of the present disclosure. As shown in FIG. 5, the gating circuit 500 in this example includes a series circuit having an even number of inverters 510, 520 connected in series. The series circuit receives the first power-on-control signal POC1 123 as an input signal and generates the second power-on-control signal POC2 124 as an output signal. The even number of inverters can provide a time delay between the POC1 signal 123 and the POC2 signal 124, and ensure a consistent logic state between the POC1 signal 123 and the POC2 signal 124. In one embodiment, the even number may be designed to be large enough to ensure an enough time delay between the POC1 signal 123 and the POC2 signal 124, such that the POC2 signal 124 is generated after the POC1 signal 123 has reached a stable logic state.

According to some embodiments of the present teaching, the I/O circuit includes one or more additional gating circuits, each of which has a structure as that shown in FIG. 3 or FIG. 5. These gating circuits are configured to generate POC signals and control a signal sequence of all POC signals based on a predetermined design, to ensure a desirable timing sequence of signals in the I/O circuit. The desirable timing sequence may be for one or more signals other than the data signal and the output enable signal.

Figure 6:
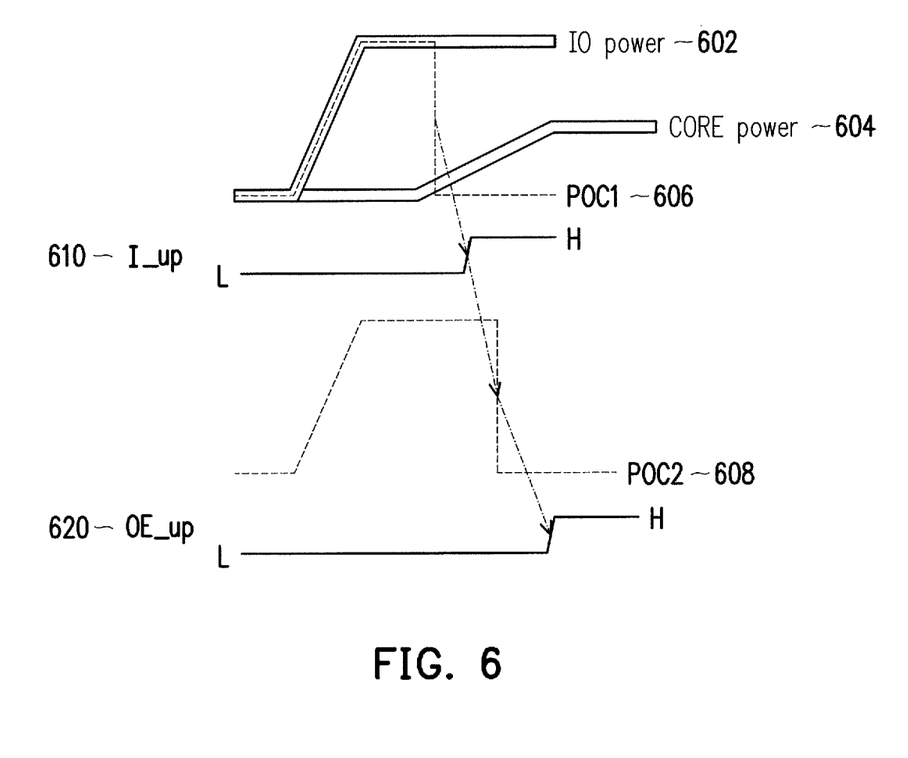
FIG. 6 illustrates an exemplary circuit behavior during power ramp-up of an input/output circuit, in accordance with some embodiments of the present disclosure.

FIG. 6 illustrates an exemplary circuit behavior during a power ramp-up of an input/output circuit, e.g. the circuit 100 in FIG. 1, in accordance with some embodiments of the present disclosure. As shown in FIG. 6, the I/O power 602 of the I/O portion 120 first increases to a high voltage state within the I/O voltage domain during the power ramp-up process. The first POC power of POC1 606 and the second POC power of POC2 608 increase together with the I/O power 602. In this example, two separate POC signals POC1 and POC2 are used to enable shifting operations at the first level shifter 121 and the second level shifter 122 respectively, as shown in FIG. 1. That is, in response to a low voltage state of the POC1 signal 606, the first level shifter 121 will start to work normally as a level up shifter to shift up the voltage level of the I_up signal 610; and in response to a low voltage state of the POC2 signal 608, the second level shifter 122 will start to work normally as a level up shifter to shift up the voltage level of the OE_up signal 620.

After the I/O power 602 increases to the high voltage state, the core power 604 of the core portion 110 increases to a high voltage state within the core voltage domain. During the increasing process of the core power 604, the POC power of POC1 606 is lowered to a low voltage state, e.g. due to a control signal of the gating circuit. In response to the low voltage state of the POC1 signal 606, the first level shifter 121 starts to work normally as a level up shifter to shift up the voltage level of the I_up signal 610. As shown in FIG. 6, after the POC1 606 is lowered to the low voltage state, the I_up signal 610 increases from the low voltage state L to the high voltage state H.

As discussed above, the gating circuit controls the time sequence for generating the two POC signals: the POC1 signal 606 and the POC2 signal 608, such that the POC1 signal 606 is generated with a low voltage state before the POC2 signal 608 is generated with the low voltage state. As such, the POC1 signal enters the first level shifter 121 to enable generation of the I_up signal 610 before the POC2 signal enters the second level shifter 122 to enable generation of the OE_up signal 620. Here, the two POC signals serve as gating signals of the first level shifter 121 and the second level shifter 122 respectively before the powers are ready.

As shown in FIG. 6, after the I_up signal 610 reaches a stable high voltage state H, the POC2 signal 608 is lowered to the low voltage state to trigger the normal operation of the second level shifter 122. Then, the second level shifter 122 shifts up the voltage level of the OE_up signal 620 from the low voltage state L to the high voltage state H. As discussed above, this time dependent relationship between the POC1 signal 606 and the POC2 signal 608 ensures that no glitch can occur during the power ramp-up process of the I/O circuit. Specifically, in accordance with this embodiment, the signal timing sequence of the I/O circuit includes the following in order: POC1 signal is activated by being decreased to a low voltage state, I_up data signal is activated by being increased to a high voltage state, POC2 signal is activated by being decreased to a low voltage state, and OE_up signal is activated by being increased to a high voltage state.

Figure 7:
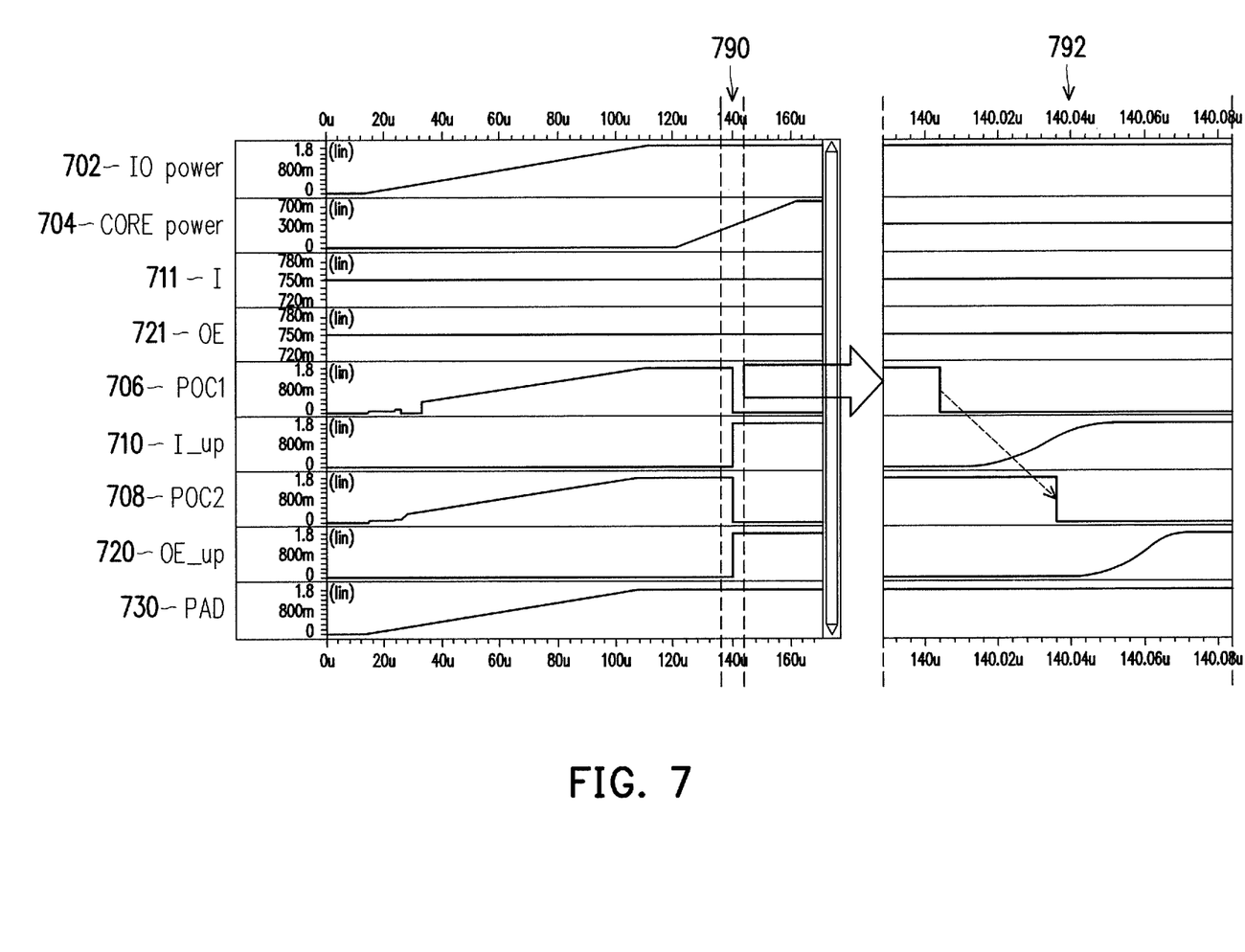
FIG. 7 illustrates an example of detailed circuit behaviors during power ramp-up of an input/output circuit, in accordance with some embodiments of the present disclosure.

FIG. 7 illustrates an example of detailed circuit behaviors during power ramp-up of an input/output circuit, e.g. the circuit 100 in FIG. 1, in accordance with some embodiments of the present disclosure. As shown in FIG. 7, the I/O power 702 first increases to a high voltage state within the I/O voltage domain during the power ramp-up process. The first POC power of POC1 706 and the second POC power of POC2 708 follow the I/O power 602 to increase to the high I/O voltage domain as well. In this example, two separate POC signals POC1 and POC2 are used to enable shifting operations at the first level shifter 121 and the second level shifter 122 respectively, as shown in FIG. 1. That is, in response to a low voltage state of the POC1 signal 706, the first level shifter 121 will start to work normally as a level up shifter to shift up the voltage level of the I_up signal 710; and in response to a low voltage state of the POC2 signal 708, the second level shifter 122 will start to work normally as a level up shifter to shift up the voltage level of the OE_up signal 720.

After the I/O power 702 increases to the high voltage state, the core power 704 increases to a high voltage state within the core voltage domain. During the increasing process of the core power 704, the POC power of POC1 706 is lowered to a low voltage state, e.g. due to a control signal of the gating circuit. The circuit behaviors within the portion 790 can be seen in more detail in the corresponding enlarged view 792. As shown in the enlarged view 792, in response to the low voltage state of the POC1 signal 706, the voltage level of the I_up signal 710 is increased up to the high voltage state. In this example, the first level shifter 121 shifts the data signal I 711 from a low core voltage domain 0.75 V to a high I/O voltage domain 1.8 V to become the level-up data signal I_up 710.

As discussed above, the gating circuit controls the time sequence for generating the two POC signals: the POC1 signal 706 and the POC2 signal 708, such that the POC1 signal 706 is generated with a low voltage state before the POC2 signal 708 is generated with the low voltage state. As such, the POC1 signal enters the first level shifter 121 to enable generation of the I_up signal 710 before the POC2 signal enters the second level shifter 122 to enable generation of the OE_up signal 720. Here, the two POC signals serve as gating signals of the first level shifter 121 and the second level shifter 122 respectively before the powers are ready.

As shown in the enlarged view 792, after the POC1 signal 706 is lowered to a low voltage state, the POC2 signal 708 is lowered to the low voltage state to trigger the normal operation of the second level shifter 122. Then, in response to the low voltage state of the POC2 signal 708, the voltage level of the OE_up signal 720 is increased up to the high voltage state. In this example, the second level shifter 122 shifts the OE signal 721 from a low core voltage domain 0.75 V to a high I/O voltage domain 1.8 V to become the level-up OE signal OE_up 720. As discussed above, this time dependent relationship between the POC1 signal 706 and the POC2 signal 708 ensures that no glitch can occur at the pad voltage 730 during the power ramp-up process of the I/O circuit, because the level-up OE signal OE_up 720 is activated to reach the high voltage state after the level-up data signal I_up 710 is activated to reach the high voltage state.

As shown in FIG. 7, the time duration from the voltage change of the POC1 signal 706 to the voltage change of the POC2 signal 708 is approximately 30 nanoseconds, which is much shorter than a typical time duration of power ramp-up, e.g. 100 microseconds. As such, the disclosed time sequence control the POC1 signal 706 and the POC2 signal 708 will not impact the power ramp-up time of the I/O circuit.

Figure 8:
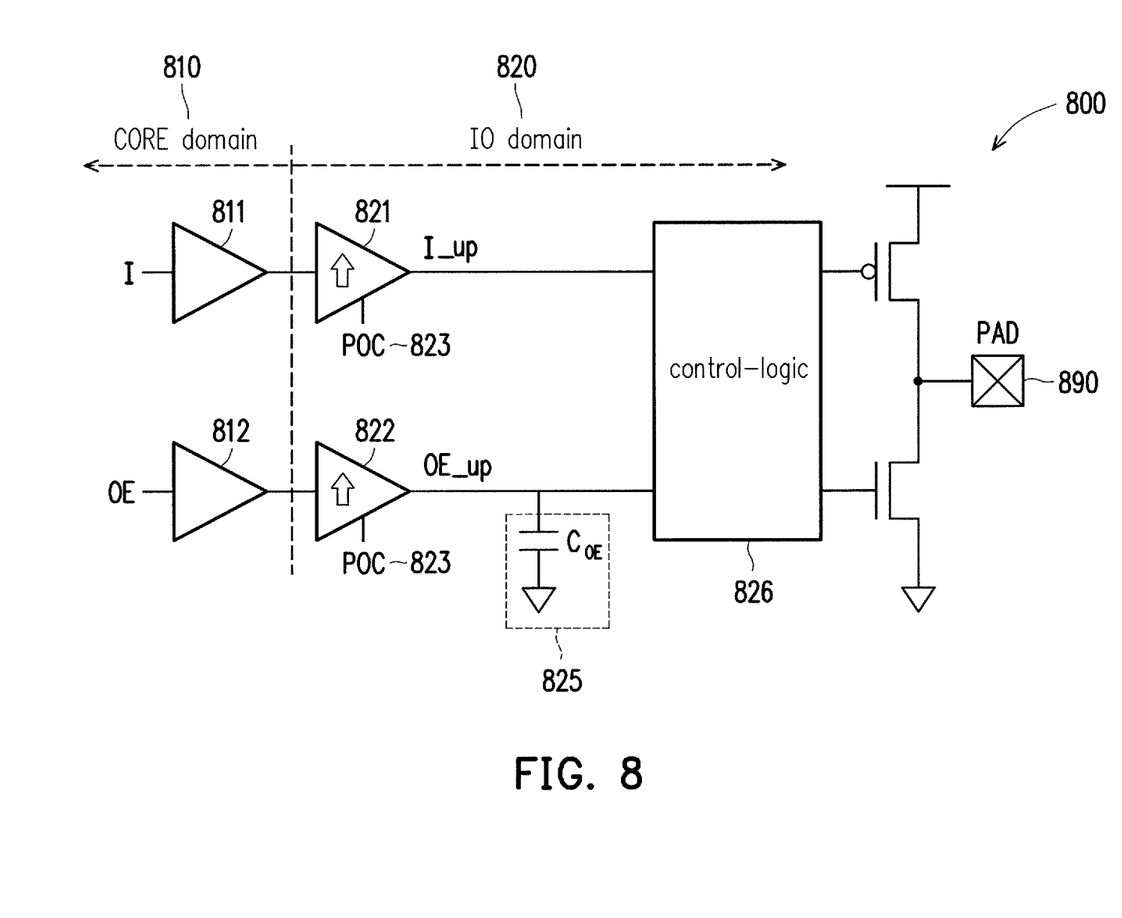
FIG. 8 illustrates an exemplary block diagram of another circuit coupled to an input/output pad, in accordance with some embodiments of the present disclosure.

FIG. 8 illustrates an exemplary block diagram of another circuit 800 coupled to an input/output pad 890, in accordance with some embodiments of the present disclosure. In accordance with one embodiment, the circuit 800 may be part of a chip in an integrated circuit system. The chip can communicate with other chips in the system via the I/O pad 890 controlled by the I/O circuit 800. As shown in FIG. 8, the circuit 800 includes two portions, a core portion 810 having a first voltage domain and an I/O portion 820 having a second voltage domain.

In this example, the core portion 810 includes a first buffer 811 that receives an input data signal I and generates a smoothed data signal with a same voltage level as the input data signal I. The input data signal I may be generated by a core circuit connected to the first buffer 811. The core circuit (not shown) performs a core function of the chip according to customer design. The core circuit generates the input data signal I to output data to another chip via the I/O pad 890. The input data signal I generated by the core circuit has a voltage within a core domain, e.g. 0 V to 0.75 V.

The core portion 110 in this example also includes a second buffer 812 that receives an output enable signal OE and generates a smoothed OE signal with a same voltage level as the output enable signal OE. The output enable signal OE is also generated by the core circuit connected to the second buffer 812. The core circuit generates the output enable signal OE to control the data output to another chip via the I/O pad 890. The output enable signal OE generated by the core circuit has a voltage within the core domain, e.g. 0 V to 0.75 V.

The I/O portion 820 in this example includes a first level shifter 821 that is coupled to the first buffer 811 and receives the smoothed data signal from the first buffer 811. The first level shifter 821 can shift the smoothed data signal from the core voltage domain to an I/O voltage domain, e.g. 0 V to 1.98 V. The I/O voltage domain in this example is higher than the core voltage domain, such that the first level shifter 821 can shift the smoothed data signal from a low voltage state to a high voltage state. That is, the first level shifter 821 is a level up shifter in this example. The shifting operation at the first level shifter 821 is controlled by a POC signal 823. The shifting operation will be performed upon a triggering of the POC signal 823. That is, a state change (e.g. from a high voltage state to a low voltage state) of the POC signal 823 will enable the first level shifter 821 to shift the smoothed data signal from the core voltage domain to the I/O voltage domain, and to generate a level-up data signal I_up within the I/O voltage domain. The level-up data signal I_up is to be sent or output to another chip via the I/O pad 890.

The I/O portion 820 in this example also includes a second level shifter 822 that is coupled to the second buffer 812 and receives the smoothed OE signal from the second buffer 812. The second level shifter 822 can shift the smoothed OE signal from the core voltage domain to the I/O voltage domain, e.g. 0 V to 1.98 V. The I/O voltage domain in this example is higher than the core voltage domain, such that the second level shifter 822 can shift the smoothed OE signal from a low voltage state to a high voltage state. That is, the second level shifter 822 is a level up shifter in this example. The shifting operation at the second level shifter 822 is controlled by the POC signal 823 as well. The shifting operation will be performed upon a triggering of the POC signal 823. That is, a state change (e.g. from a high voltage state to a low voltage state) of the POC signal 823 will enable the second level shifter 822 to shift the smoothed OE signal from the core voltage domain to the I/O voltage domain, and to generate a level-up OE signal OE_up within the I/O voltage domain. The level-up OE signal OE_up is to be used to control the data output of the level-up data signal I_up to another chip via the I/O pad 890.

While the same POC signal serves as a gating signal of both the first level shifter 821 and the second level shifter 822 before the powers are ready, the I/O portion 820 also includes a delay circuit 825 that is coupled to the second level shifter 822 and configured to generate a delayed OE_up signal based on the OE_up signal output by the second level shifter 822. In this embodiment, the delay circuit 825 includes a capacitor C_OE coupled to an output of the second level shifter 822. The capacitor C_OE may be designed to have a capacitance that is large enough to ensure that the delayed OE_up signal is generated after the data signal I_up has reached a stable logic state. Accordingly, the delay circuit 825 can control the level-up OE signal OE_up is delayed to enter the control logic circuit 826 with the high voltage state after the level-up data signal I_up enters the control logic circuit 126 with a stable high voltage logic state, to prevent glitch from occurring during a power ramp-up process of the I/O circuit. In accordance with various embodiments, the delay circuit 825 may have a structure different from that shown in FIG. 8 and still achieve a time delay effect for the level-up OE signal OE_up. For example, the delay circuit 825 can have a time delay effect, based on at least one of: a resistor, a capacitor, a transistor, a diode, and a timer.

The I/O portion 820 in this example also includes a control logic circuit 826 that is coupled to the first level shifter 821 and the second level shifter 822 and is configured for driving the I/O pad 890 to a voltage level based on the data signal I_up and the delayed OE_up signal. That is, the control logic circuit 826 can output the data signal I_up via the I/O pad 890 in response to the delayed OE_up signal. Specifically, when the delayed OE_up signal is not asserted, the control logic circuit 826 is in a tri-state mode and does not drive the I/O pad 890. When the delayed OE_up signal is asserted, the control logic circuit 826 drives the I/O pad 890 to a voltage level and/or a logical state corresponding to the data signal I_up. Although not shown in FIG. 8, the circuit 800 may also include an input buffer that is in the I/O portion 820 to receive an input signal from another chip via the I/O pad 890 and drive the input signal into a level down shifter in the core portion 810. The level down shifter can shift the input signal from the I/O voltage domain to the core voltage domain for the core circuit to receive the input signal with a proper voltage domain.

Figure 9:
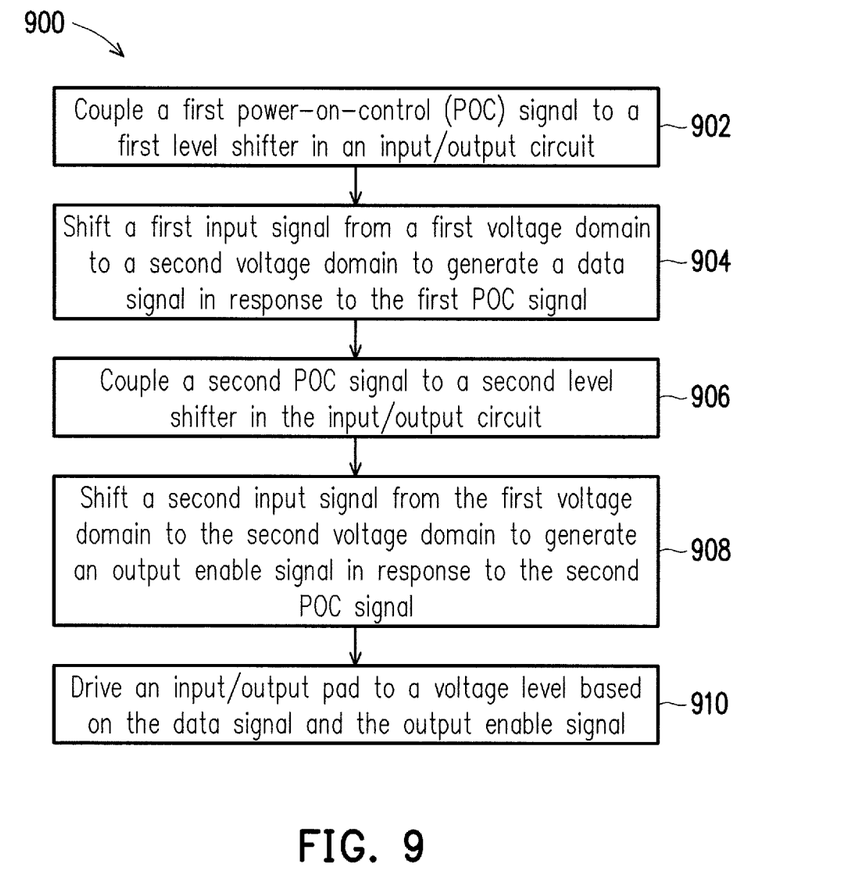
FIG. 9 is a flow chart illustrating an exemplary method for preventing glitch in a circuit coupled to an input/output pad, in accordance with some embodiments of the present disclosure.

FIG. 9 is a flow chart illustrating an exemplary method 900 for preventing glitch in a circuit coupled to an input/ output pad, in accordance with some embodiments of the present disclosure. At operation 902, a first power-on-control (POC) signal is coupled to a first level shifter in an input/output circuit. A first input signal is shifted at operation 904 from a first voltage domain to a second voltage domain to generate a data signal in response to the first POC signal. A second POC signal is coupled at operation 906 to a second level shifter in the input/output circuit. A second input signal is shifted at operation 908 from the first voltage domain to the second voltage domain to generate an output enable signal in response to the second POC signal. At operation 910, an input/output pad is driven to a voltage level based on the data signal and the output enable signal. The order of the operations shown in FIG. 9 may be changed according to different embodiments of the present disclosure.

In an embodiment, a circuit coupled to an input/output pad is disclosed. The circuit includes: a first level shifter, a second level shifter, and a control logic circuit. The first level shifter is configured for generating a data signal. The second level shifter is configured for generating an output enable signal. The first and second level shifters are controlled by first and second power-on-control signals, respectively. The control logic circuit is coupled to the first level shifter and the second level shifter, and configured for driving the input/output pad to a voltage level based on the data signal and the output enable signal.

In another embodiment, a circuit coupled to an input/output pad is disclosed. The circuit includes: a first level shifter, a second level shifter, a delay circuit and a control logic circuit. The first level shifter is configured for generating a data signal. The second level shifter is configured for generating an output enable signal. The first and second level shifters are controlled by a power-on-control signal. The delay circuit is coupled to the second level shifter and configured to generate a delayed output enable signal based on the output enable signal. The control logic circuit is coupled to the first level shifter and the second level shifter, and configured for driving the input/output pad to a voltage level based on the data signal and the delayed output enable signal.

In yet another embodiment, a method for preventing glitch in a circuit coupled to an input/output pad is disclosed. The method includes: coupling a first power-on-control signal to a first level shifter in the circuit; in response to the first power-on-control signal, shifting a first input signal from a first voltage domain to a second voltage domain to generate a data signal; coupling a second power-on-control signal to a second level shifter in the circuit; in response to the second power-on-control signal, shifting a second input signal from the first voltage domain to the second voltage domain to generate an output enable signal; and driving the input/output pad to a voltage level based on the data signal and the output enable signal.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit coupled to an input/output pad, comprising:
   a first level shifter configured for generating a data signal, wherein the first level shifter is controlled by a first power-on-control signal;
   a second level shifter configured for generating an output enable signal, wherein the second level shifter is controlled by a second power-on-control signal;
   a gating circuit configured to generate the first and second power-on-control signals in a manner such that the first power-on-control signal enables the first level shifter to generate the data signal before the second power-on-control signal enables the second level shifter to generate the output enable signal; and
   a control logic circuit coupled to the first level shifter and the second level shifter, and configured for driving the input/output pad to a voltage level based on the data signal and the output enable signal.

2. The circuit of claim 1, wherein:
   the first level shifter is configured to receive a first input signal at a first voltage domain and shift the first input signal to a second voltage domain to generate the data signal in response to the first power-on-control signal; and
   the second level shifter is configured to receive a second input signal at the first voltage domain and shift the second input signal to the second voltage domain to generate the output enable signal in response to the second power-on-control signal.

3. The circuit of claim 2, wherein the second voltage domain is higher than the first voltage domain.

4. The circuit of claim 1, wherein the gating circuit is configured to control a signal sequence of the first and second power-on-control signals.

5. The circuit of claim 1, wherein the gating circuit comprises:
   a first transistor gated by the data signal;
   a second transistor gated by a signal that is a logical invert of the first power-on-control signal; and
   a first inverter configured to generate the second power-on-control signal based on outputs of the first transistor and the second transistor, such that the second power-on-control signal is generated based on whether the data signal has reached a stable logic state.

6. The circuit of claim 5, wherein the gating circuit further comprises:
   a second inverter coupled between the second transistor and the first inverter;
   a third transistor coupled to the first transistor and gated by an input signal of the first level shifter;
   a fourth transistor coupled to the first transistor and gated by a signal that is a logical invert of the input signal of the first level shifter;
   a fifth transistor coupled to the second transistor and gated by the first power-on-control signal; and
   a sixth transistor coupled to the first transistor and gated by an output signal of the second inverter.

7. The circuit of claim 1, wherein:
   the gating circuit comprises a series circuit having an even number of inverters connected in series;
   the series circuit receives the first power-on-control signal as an input signal and generates the second power-on-control signal as an output signal; and
   the even number is large enough to ensure that the second power-on-control signal is generated after the first power-on-control signal enables the first level shifter to generate the data signal.

8. The circuit of claim 1, wherein the gating circuit occupies an area that is less than a predetermined percentage of a total area of the circuit.

9. The circuit of claim 1, further comprising an additional gating circuit.

10. The circuit of claim 9, wherein the additional gating circuit is configured to generate a third power-on-control signal and control a signal sequence of the first, second and third power-on-control signals based on a predetermined design.

11. The circuit of claim 1, wherein the control logic circuit is configured to drive the input/output pad to a voltage level corresponding to the data signal when the output enable signal is asserted.

12. A circuit coupled to an input/output pad, comprising:
a first level shifter configured for generating a data signal;
a second level shifter configured for generating an output enable signal, wherein the first and second level shifters are controlled by a power-on-control signal;
a delay circuit coupled to the second level shifter and configured to generate a delayed output enable signal based on the output enable signal, wherein the delay circuit comprises a capacitor coupled to an output of the second level shifter; and
a control logic circuit coupled to the first level shifter and the second level shifter, and configured for driving the input/output pad to a voltage level based on the data signal and the delayed output enable signal.

13. The circuit of claim 12, wherein:
the first level shifter is configured to receive a first input signal at a first voltage domain and shift the first input signal to a second voltage domain to generate the data signal in response to the first power-on-control signal; and
the second level shifter is configured to receive a second input signal at the first voltage domain and shift the second input signal to the second voltage domain to generate the output enable signal in response to the second power-on-control signal.

14. The circuit of claim 13, wherein the second voltage domain is higher than the first voltage domain.

15. The circuit of claim 12, wherein the delayed output enable signal is generated after the data signal is generated.

16. The circuit of claim 12, wherein the capacitor has a capacitance that is large enough to ensure that the delayed output enable signal is generated after the data signal has reached a stable logic state.

17. A method for preventing glitch in a circuit coupled to an input/output pad, comprising:
coupling a first power-on-control signal to a first level shifter in the circuit;
in response to the first power-on-control signal, shifting a first input signal from a first voltage domain to a second voltage domain to generate a data signal;
coupling a second power-on-control signal to a second level shifter in the circuit;
in response to the second power-on-control signal, shifting a second input signal from the first voltage domain to the second voltage domain to generate an output enable signal after the data signal has reached a stable logic state during a power ramp-up process of the circuit; and
driving the input/output pad to a voltage level based on the data signal and the output enable signal.

18. The method of claim 17, wherein the second voltage domain is higher than the first voltage domain.

19. The method of claim 17, wherein the first power-on-control signal is not coupled to the second level shifter, and wherein the second power-on-control signal is not coupled to the first level shifter.

20. The method of claim 17, further comprising:
generating the first power-on-control signal; and
generating the second power-on-control signal after a time duration starting when the first power-on-control signal is generated, wherein the time duration is within a power ramp-up process of the circuit.

* * * * *